US009286976B2

(12) United States Patent
Lin et al.

(10) Patent No.: US 9,286,976 B2
(45) Date of Patent: Mar. 15, 2016

(54) APPARATUSES AND METHODS FOR DETECTING WRITE COMPLETION FOR RESISTIVE MEMORY

(71) Applicant: Intel Corporation, Santa Clara, CA (US)

(72) Inventors: Blake Lin, Portland, OR (US); Cyrille Dray, Hillsboro, OR (US); Ananda Roy, Hillsboro, OR (US); Liqiong Wei, Portland, OR (US); Fatih Hamzaoglu, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/290,623

(22) Filed: May 29, 2014

(65) Prior Publication Data

US 2015/0348623 A1  Dec. 3, 2015

(51) Int. Cl.
*G11C 11/00* (2006.01)
*G11C 13/00* (2006.01)

(52) U.S. Cl.
CPC .......... *G11C 13/004* (2013.01); *G11C 13/0069* (2013.01)

(58) Field of Classification Search
CPC .......................... G11C 13/004; G11C 13/0069
USPC ................................................. 365/148, 226
See application file for complete search history.

(56) References Cited

U.S. PATENT DOCUMENTS

| 2009/0323392 | A1 | 12/2009 | Fasoli et al. |
| 2010/0110767 | A1* | 5/2010 | Katoh et al. ............ 365/148 |
| 2010/0232206 | A1 | 9/2010 | Li et al. |
| 2010/0271860 | A1 | 10/2010 | Muraoka et al. |
| 2011/0267872 | A1 | 11/2011 | Toda |
| 2013/0121058 | A1 | 5/2013 | Chiu et al. |

OTHER PUBLICATIONS

International Search Report and Written Opinion for PCT Application No. PCT/US2015/028080, dated Jul. 16, 2015, 12 pages.

* cited by examiner

*Primary Examiner* — Richard Elms
*Assistant Examiner* — Mohammed A Bashar
(74) *Attorney, Agent, or Firm* — Schwabe, Williamson & Wyatt, P.C.

(57) ABSTRACT

Described are apparatuses and methods for improving resistive memory energy efficiency and reliability. An apparatus may include a resistive memory cell coupled to a conductive line. The apparatus may further include a driver coupled to the conductive line to drive current for the resistive memory cell during a write operation. The resistance of the driver may be selectively increased for two or more time periods during the write operation for detecting a voltage change on the conductive line. The current for the write operation may be turned off when the voltage change is detected to improve resistive memory energy efficiency and reliability.

20 Claims, 11 Drawing Sheets

APPARATUSES AND METHODS FOR DETECTING WRITE COMPLETION FOR RESISTIVE MEMORY

TECHNICAL FIELD

This disclosure relates generally to electronic circuits. More particularly but not exclusively, the present disclosure relates to write completion detection circuits for resistive memories.

BACKGROUND

On-chip embedded memory with non-volatility can enable energy and computational efficiency. Several new types of solid-state, high-density, non-volatile memories store information using a memory element with a variable resistance. The resistance of spin transfer torque-magnetic random access memory (STT-MRAM) depends on the relative magnetization polarities of two magnetic layers. Other variable resistance memories include resistive random access memory (ReRAM) and conductive bridging random access memory (CbRAM), whose resistances depend on the formation and elimination of conduction paths through a dielectric or an electrolyte. There is also phase change memory (PCM), for which the resistivity of a cell depends on the crystalline or amorphous state of a chalcogenide.

For these resistive memories, read operation is generally faster than write operation, and the write current is generally larger than the read current. Unlike static random access memory (SRAM) and dynamic random access memory (DRAM), which consume transient write power, resistive memory still consumes static write power whether or not the cell is flipped during write operation. The read power of these resistive memories may also be static depending on the implementation of the read sensor. Reducing read and write power is a challenge for resistive memory in order to meet the targets for high performance and low power applications.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
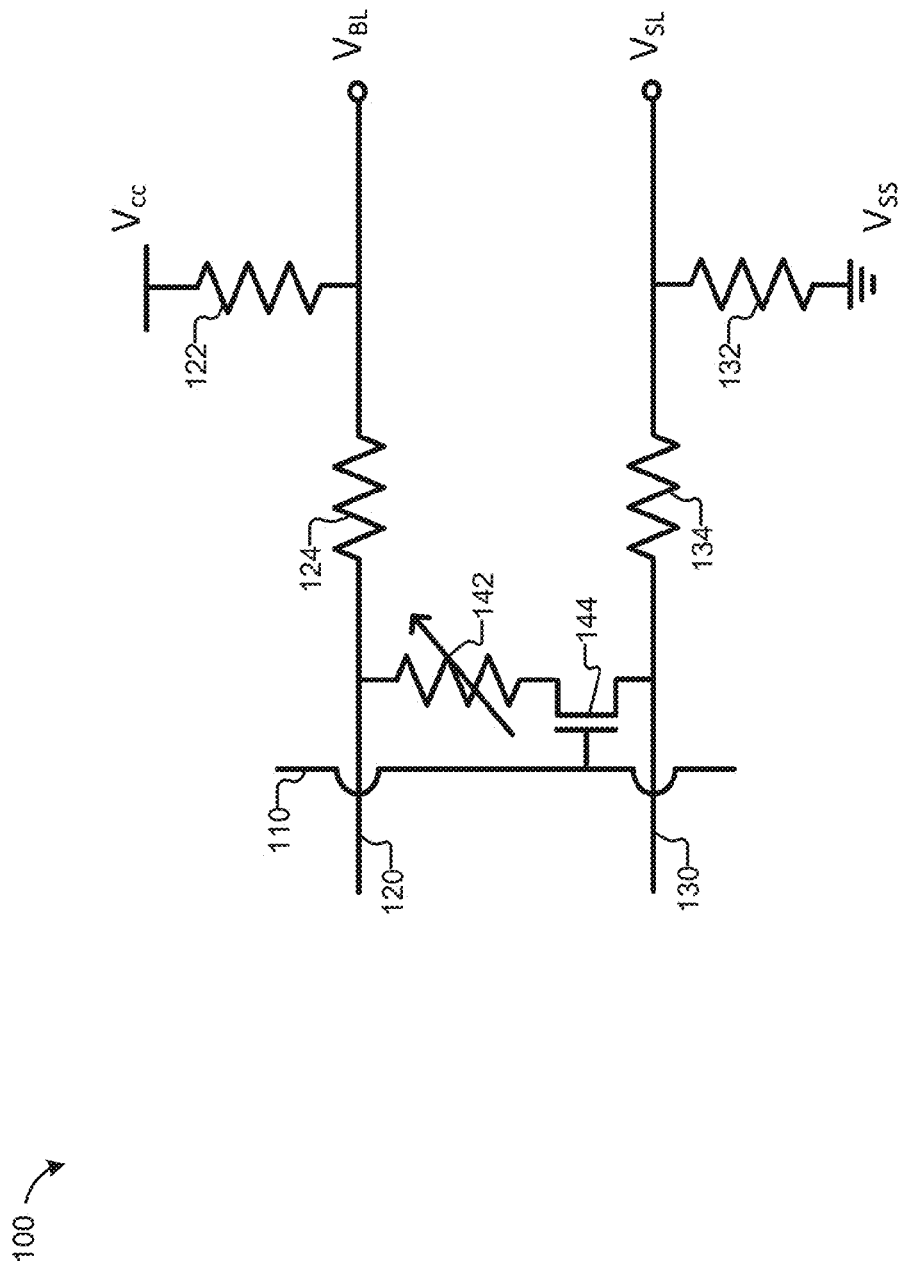
FIG. 1 is a schematic diagram of one write path, incorporating aspects of the present disclosure, in accordance with various embodiments.

The embodiments describe write operations and design techniques for resistive memories to lower power consumption. In one embodiment, an apparatus may include a resistive memory cell coupled to a conductive line. The apparatus may further include a driver coupled to the conductive line to drive current for the resistive memory cell during a write operation. In such an embodiment, the resistance of the driver may be selectively increased for two or more time periods during the write operation to detect a voltage change on the conductive line. The current for the write operation may be turned off to improve resistive memory energy efficiency when a voltage change indicating a write completion is detected.

Although the underlying memory element for resistive memory technologies varies, methods for reading and writing are electrically similar and are encompassed by embodiments. The embodiments can be combined to achieve the best energy savings for resistive memories.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal, or data/clock signal. The meaning of "a," "an," and "the" include plural references. The meaning of "in" includes "in" and "on."

The terms "substantially," "close," "approximately," "near," and "about" generally refer to being within +/−20% of a target value. The term "scaling" generally refers to converting a design (schematic and layout) from one process technology to another process technology. The term "scaling" generally also refers to downsizing layout and devices within the same technology node. The term "scaling" may also refer to adjusting (e.g., slowing down) a signal frequency relative to another parameter, for example, power supply level.

Unless otherwise specified, the use of the ordinal adjectives "first," "second," "third," etc., to describe a common object merely indicate that different instances of like objects are being referred to, and are not intended to imply that the objects so described must be in a given sequence, either temporally, spatially, in ranking, or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors, or other devices implementing transistor functionality, like carbon nano tubes or spintronic devices. Source and drain terminals may be identical terminals and are interchangeably used herein. Those skilled in the art will appreciate that other transistors, for example, Bipolar junction transistors (BJT) may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 is a schematic diagram of one write path, incorporating aspects of the present disclosure, in accordance with various embodiments. Write path 100 may be used in a resistive memory. Write path 100 may include word line 110, bit line 120, and source line 130. Write path 100 may further include bit line driver 122, bit line parasitic resistor 124, cell 142, access transistor 144, source line parasitic resistor 134, and source line driver 132. In embodiments, bit line driver 122, bit line parasitic resistor 124, cell 142, access transistor 144, source line parasitic resistor 134, and/or source line driver 132 may be included in a memory element of the resistive memory. The resistive memory may include a plurality of memory elements.

In embodiments, word line 110 may be received by a plurality of memory elements. For example, word line 110 may be coupled to the gate terminal of access transistor 144. One terminal of cell 142 may be coupled to bit line 120, and the other end of cell 142 may be coupled to access transistor 144. Access transistor 144 may be further coupled to source line 130. In embodiments, a write current may flow across bit line driver 122, bit line parasitic resistor 124, cell 142, access transistor 144, source line parasitic resistor 134, and source line driver 132 when the voltage of word line 110 is raised, and access transistor 144 is turned on. The bit line voltage ($V_{BL}$) at bit line 120 and the source line voltage ($V_{SL}$) at source line 130 may be measured based on supply voltage ($V_{CC}$) and the resistance associated with various components presented in write path 100, represented by $R_{reference\_number}$, for example, as shown in Eq. 1.

$$V_{BL} = \frac{R_{124} + R_{142} + R_{144} + R_{134} + R_{132}}{R_{124} + R_{142} + R_{144} + R_{134} + R_{132} + R_{122}} V_{CC} \quad \text{Eq. 1}$$

For general memory technology that requires electric current to switch bits between memory states, the write operation may consume substantial power. Due to process-induced random variation among memory bits, the switching time of each bit is not identical. However, in order to keep the write-error rate of a memory array under a certain level, the duration of the write operation needs to be long enough to encompass the entire distribution of switching time. As a result, power is wasted on those bits that already switched to their intended states, but that continue to receive unnecessary current for the remainder of the write operation.

As an example, the write-error rate may be $10^{-3}$ the midpoint of a write operation in an STT-MRAM array. In other words, 99.9% of the bits have already switched at the midpoint of the write operation. Therefore, a significant percentage of power can be saved if the peripheral circuit can detect, during a write operation, whether each bit that is being written has switched to the intended state, and adaptively reduce or turn off the write current on the bits that have already switched. In the previous example, if the write current on these switched bits may be turned off at the midpoint of the write operation, about 50% of the write power may be saved in the write operation.

As can be seen from Eq. 1, when cell 142 switches to an intended state, the resistance of cell 142 ($R_{142}$), as a variable resistance, may change to a different value. The change in resistance of cell 142 may cause a change of the write current on bit line 120, but $V_{BL}$ may substantially remain the same. However, in embodiments, when a driver, either bit line driver 122 or source line driver 132, is weakened for a short period of time, $V_{BL}$ may be sampled while the write driver is weakened. The measured difference of $V_{BL}$ in two samples is the sensing margin.

In embodiments, the resistance of bit line driver 122 ($R_{122}$) may be adjustable. Therefore, $R_{122}$ may be temporarily increased to weaken bit line driver 122. In embodiments, the sensing margin may be magnified by weakening the drive, e.g., increasing $R_{122}$ in Eq. 1. When a driver is weakened, the effective resistance of the driver becomes higher. As a result, the voltage on the line connected with the driver may show a larger difference before and after the bit switch than for a driver with lower resistance. Consider an example in which the write completion detection scheme monitors the change in $V_{BL}$. If bit line driver 122 is kept in its full driving strength during the entire duration of the write operation, a small $R_{122}$ would make $V_{BL}$ always close to $V_{CC}$. In this case, as revealed by Eq. 1, the change in $V_{BL}$ before and after the bit switch may be very small and hence not detectable. However, in embodiments, when bit line driver 122 is weakened, e.g., making $R_{122}$ larger temporarily, the change in $V_{BL}$ before and after the bit switch may be magnified while bit line driver 122 is weakened, as indicated by Eq. 1.

In embodiments, either $V_{BL}$ or $V_{SL}$ may be monitored to detect write completion in cell 142. In either case, the write driver that needs to be weakened is the driver directly connected to the line where the voltage is monitored. As an example, if the voltage to be monitored is $V_{BL}$, then bit line driver 122 may be weakened. As another example, if the voltage to be monitored is $V_{SL}$, then source line driver 132 may be weakened.

In embodiments, power may be saved by a peripheral circuit that may adaptively reduce or turn off the write current on a bit that has already switched during a write operation upon such detection. The design principles disclosed above may be implemented in any resistive memory product, e.g., STT-MRAM, ReRAM, etc., to save a significant percentage of the write power, which is in general much higher than the read power and the standby power.

Another benefit of detecting bit switching and subsequently reducing or terminating the write current is the improved reliability of memory arrays. In general, the bits that switch more quickly may be more susceptible to reliability issues, which may be exacerbated through prolonged exposure to write current. Therefore, turning off the write current on those bits as early as possible may also improve the overall reliability of the memory array. Turning off the write current as early as possible prevents unnecessary current from continuing to flow through the memory storage element, thus improving the overall reliability of the memory array.

Figure 2:
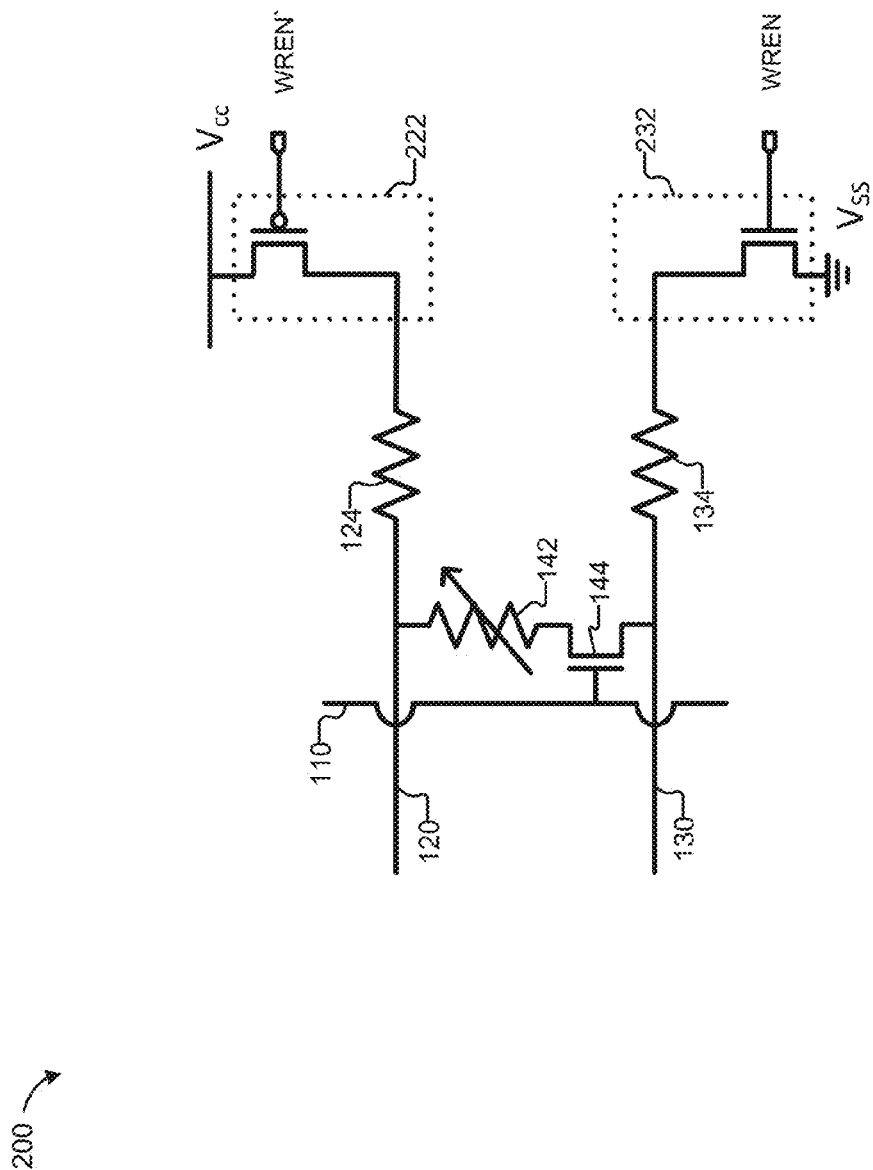
FIG. 2 is a schematic diagram of another write path, incorporating aspects of the present disclosure, in accordance with various embodiments.

FIG. 2 is a schematic diagram of write path 200, incorporating aspects of the present disclosure, in accordance with various embodiments. Those elements of FIG. 2 having the same reference numbers (or names) as the elements of any other figure can operate or function in any manner similar to that described, but are not limited to such. So as not to obscure the embodiments, elements and features discussed previously may not be repeated.

In embodiments, in order to maximize the write current and hence minimize the overall write time, the write drivers may be designed to minimize the voltage drop across each of them. In other words, the respective effective resistance of bit line driver 222 and source line driver 232 may be designed as small as possible. In embodiments, bit line driver 222 or source line driver 232 may use one or more large-width transistors. So as not to obscure the embodiments, a single transistor is used in bit line driver 222 for illustration purposes. Similarly, a single transistor is used in source line driver 232 for illustration purposes. Embodiments may include any suitable number of one or more transistors in the bit line driver 222 and/or source line driver 232.

In embodiments, a write enable signal (WREN) may be operably coupled to source line driver 232. Another signal WREN, which is complementary (e.g., having an opposite value) to WREN, may be operably coupled to bit line driver 222. Therefore, bit line driver 222 may be operable by WREN, and source line driver 232 may be operable by WREN. WREN and WREN' may work together to enable write path 200 so that the bit in cell 142 may change to its intended state in a write operation, for example, when WREN is high.

In embodiments, the write driver, either bit line driver 222 or source line driver 232, may be weakened for multiple times during a write operation for write completion detection. Weakening a write driver may have a negative impact on the overall write time, for example, if the bit switching mechanism is interrupted. For example, the switching mechanism of STT-MRAM may exhibit a tradeoff between write current and write time. Therefore, the magnitude, duration, and occurrences of the weakening may be designed such that the overall write time is not degraded or is degraded only within an acceptable margin.

Figure 3:
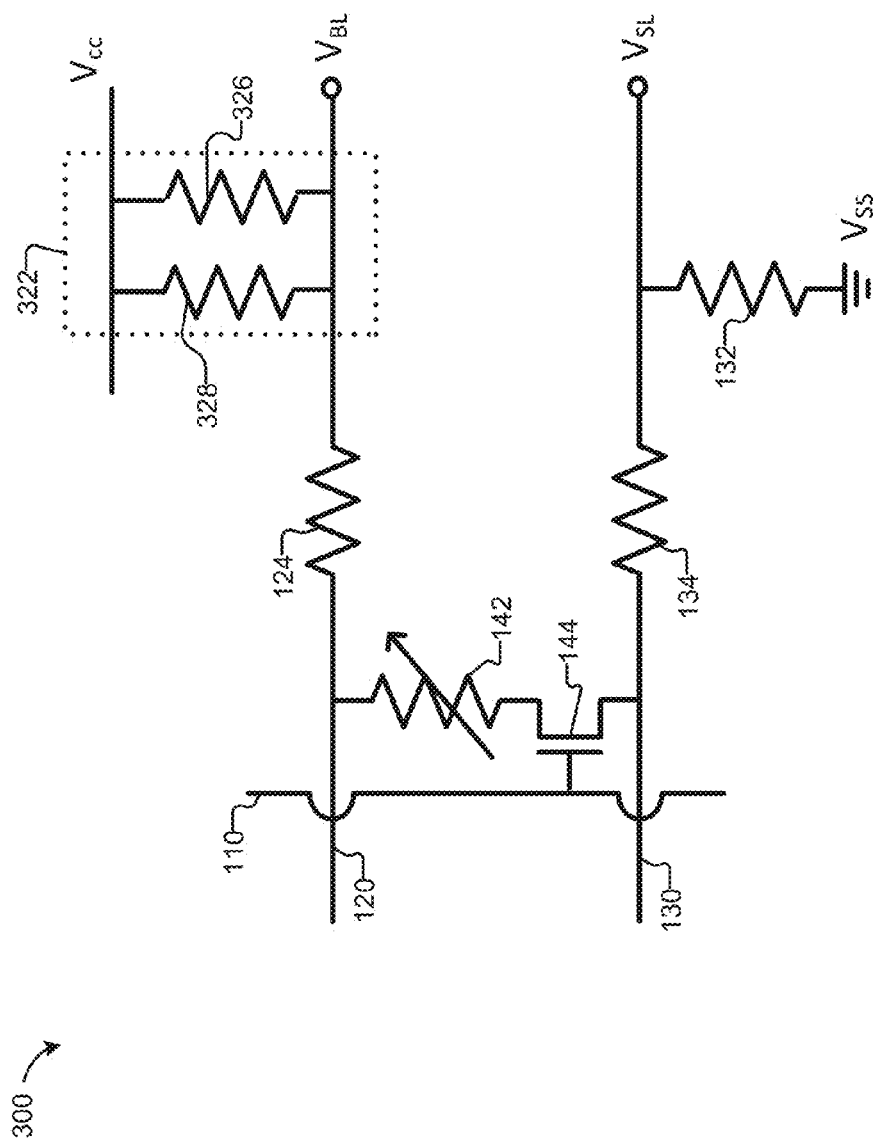
FIG. 3 is a schematic diagram of another write path, incorporating aspects of the present disclosure, in accordance with various embodiments.

FIG. 3 is a schematic diagram of write path 300, incorporating aspects of the present disclosure, in accordance with various embodiments. Those elements of FIG. 3 having the same reference numbers (or names) as the elements of any other figure can operate or function in any manner similar to that described, but are not limited to such. So as not to obscure the embodiments, elements and features discussed previously may not be repeated.

In embodiments, bit line driver 322 may include strong driver 328 and weak driver 326. Strong driver 328 may have a lower effective resistance than weak driver 326. Weak driver 326 may stay on during the entire duration of a write operation, whereas strong driver 328 may be selectively turned off to weaken bit line driver 322. When strong driver 328 is turned off, bit line 120 is only driven by weak driver 326, resulting in a higher effective resistance of bit line driver 322 between $V_{CC}$ and bit line 120, thus causing a voltage droop at $V_{BL}$.

In other embodiments, bit line driver 322 may only include strong driver 328 without weak driver 326. During a write operation, strong driver 328, and thus bit line driver 322, may be turned off to weaken bit line driver 322. In this case, due to the finite parasitic capacitance of bit bine 120, the write current would gradually reduce after strong driver 328 is turned off. In other words, bit line parasitic capacitance would become the source of charge in place of the write current during the brief weakening period when the strong driver 328 is turned off.

Figure 4:
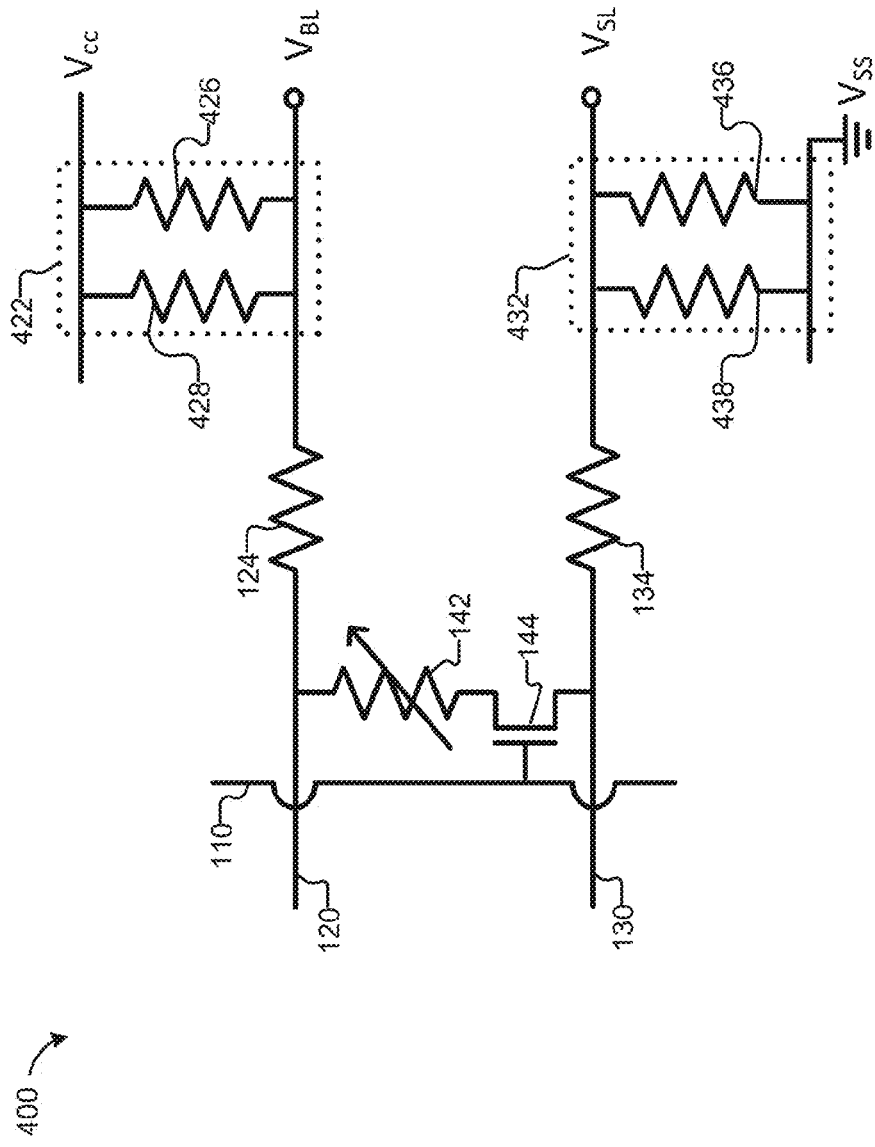
FIG. 4 is a schematic diagram of another write path, incorporating aspects of the present disclosure, in accordance with various embodiments.

FIG. 4 is a schematic diagram of write path 400, incorporating aspects of the present disclosure, in accordance with various embodiments. Those elements of FIG. 4 having the same reference numbers (or names) as the elements of any other figure can operate or function in any manner similar to that described, but are not limited to such. So as not to obscure the embodiments, elements and features discussed previously may not be repeated.

In embodiments, bit line driver 422 may include strong driver 428 and weak driver 426. Strong driver 428 may have a lower effective resistance than weak driver 426. Similarly, source line driver 432 may include strong driver 438 and weak driver 436. Strong driver 438 may have a lower effective resistance than weak driver 436.

In this case, either $V_{BL}$ or $V_{SL}$ may be monitored for the write completion detection in cell 142. As an example, when $V_{BL}$ is monitored, weak driver 426 may stay on during the entire duration of a write operation, whereas strong driver 428 may be turned off to weaken bit line driver 422. As another example, when $V_{SL}$ is monitored, weak driver 436 may stay on during the entire duration of a write operation, whereas strong driver 438 may be turned off to weaken source line driver 432. In either case, the write driver that needs to be weakened is the driver directly connected to the line where the voltage is monitored. When a write driver is weakened, the higher effective resistance of the write driver may cause a change, increase or decrease, at the voltage to be monitored. In some embodiments, $V_{BL}$ of bit line 120 may be monitored, and weakening bit line driver 422 may cause a voltage change at $V_{BL}$. In some embodiments, $V_{SL}$ of source line 130 may be monitored, and weakening source line driver 432 may cause voltage change at $V_{SL}$.

Figure 5:
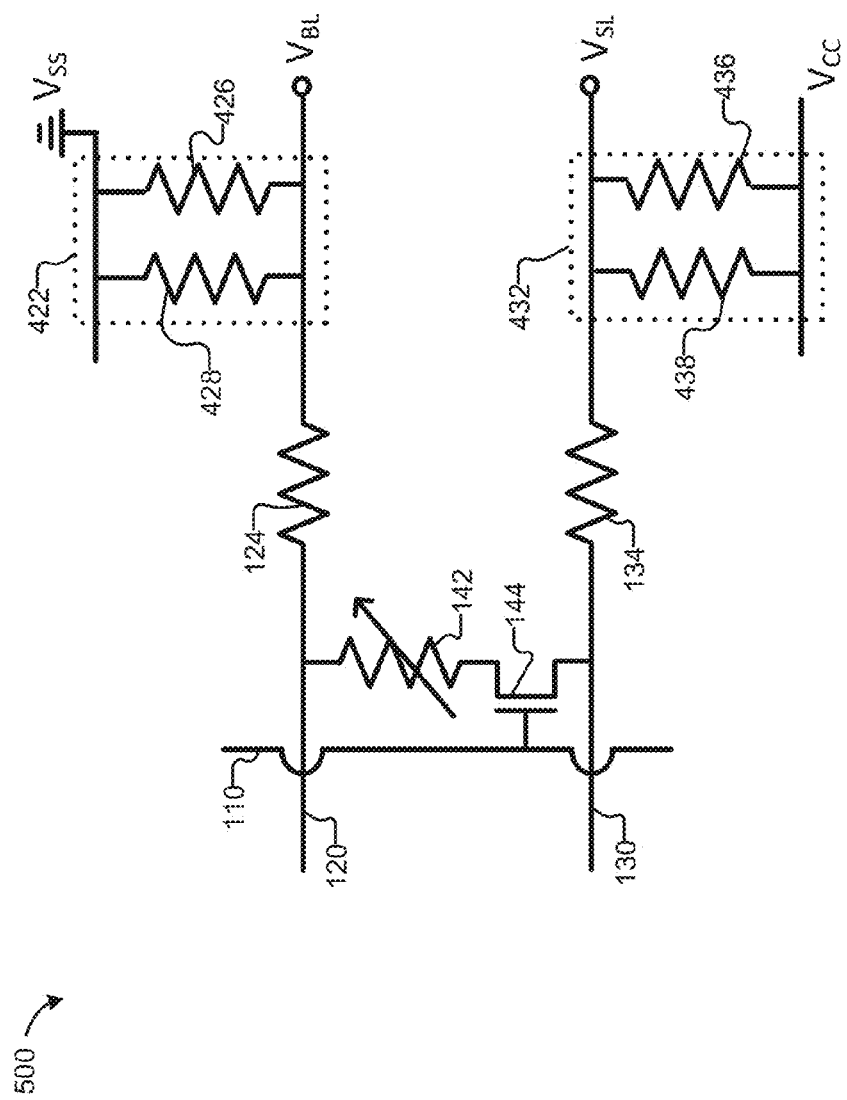
FIG. 5 is a schematic diagram of another write path, incorporating aspects of the present disclosure, in accordance with various embodiments.

FIG. 5 is a schematic diagram of write path 500, incorporating aspects of the present disclosure, in accordance with various embodiments. Those elements of FIG. 5 having the same reference numbers (or names) as the elements of any other figure can operate or function in any manner similar to that described, but are not limited to such. So as not to obscure the embodiments, elements and features discussed previously may not be repeated.

In FIG. 4, bit line driver 422 is coupled to $V_{CC}$, whereas source line driver 432 is coupled to $V_{SS}$. Consequently, the write current flows from bit line 120 to source line 130. In FIG. 5, bit line driver 422 is coupled to $V_{SS}$, whereas source line driver 432 is coupled to $V_{CC}$. Consequently, the write current flows from source line 130 to bit line 120. In embodiments, regardless of the direction of the write current, either $V_{BL}$ or $V_{SL}$ may be monitored for the write completion detection in cell 142 by weakening the corresponding write driver at the appropriate times.

Figure 6:
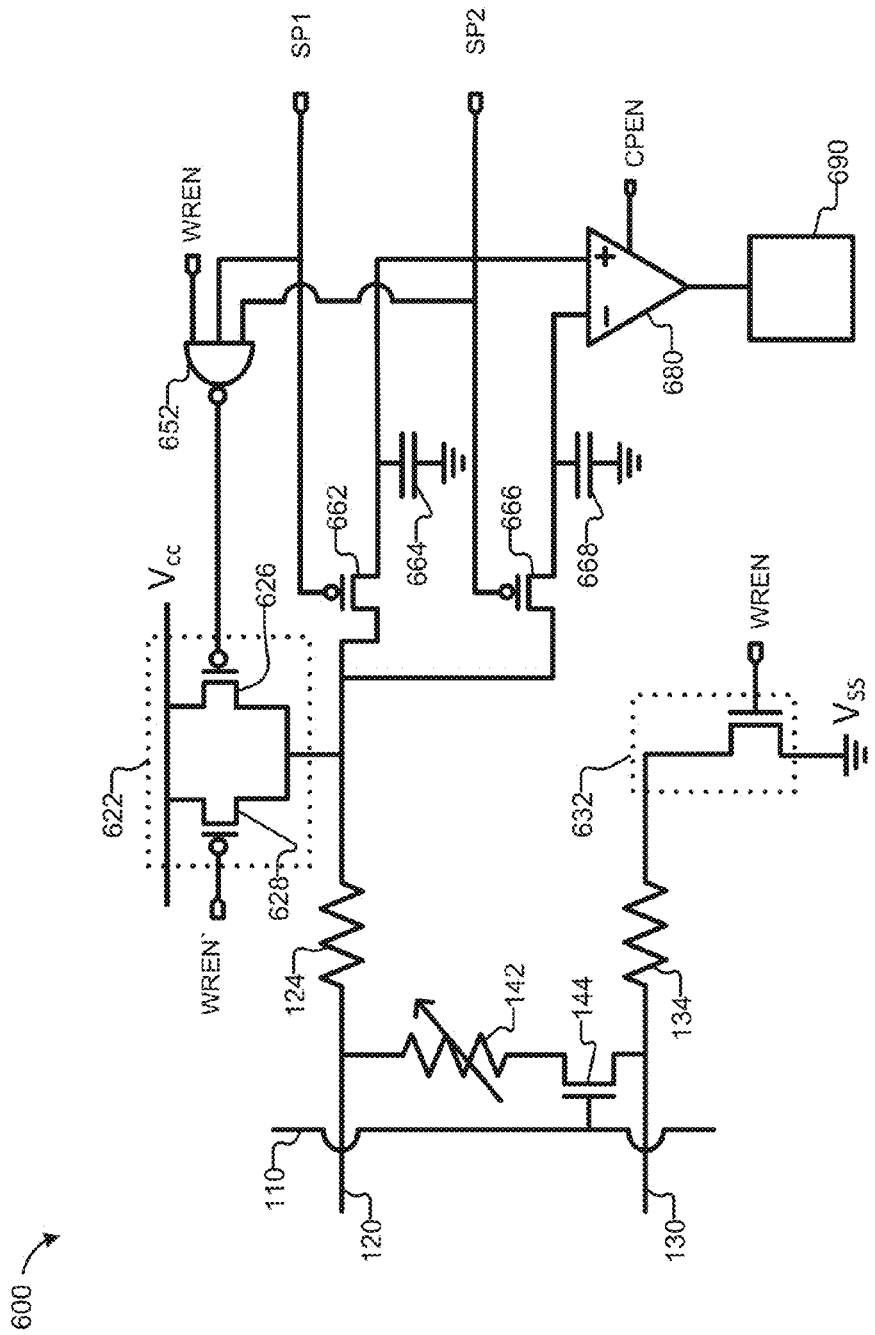
FIG. 6 is one schematic architecture for detecting write completion in a memory cell, incorporating aspects of the present disclosure, in accordance with various embodiments.

FIG. 6 illustrates schematic architecture of a write completion detection structure 600 for detecting write completion in a memory cell, incorporating aspects of the present disclosure, in accordance with various embodiments. Those elements of FIG. 6 having the same reference numbers (or names) as the elements of any other figure can operate or function in any manner similar to that described, but are not limited to such. So as not to obscure the embodiments, elements and features discussed previously may not be repeated.

In embodiments, the write current may flow from bit line 120 to source line 130. As shown, source line 130 is coupled to $V_{SS}$ via source line driver 632, which may be an NMOS source line driver. Source line driver 632 is coupled to a write enable signal WREN. Bit line 120 is coupled to $V_{CC}$ via bit line driver 622, which may include a pair of PMOS bit line drivers 628 and 626. The two bit line drivers 628 and 626 may be sized with different effective resistances, thus providing different driving strengths. For example, strong driver 626 may have a lower resistance than weak driver 628, thus providing greater driving strength.

In embodiments, weak driver 628 may stay on during the entire duration of a write operation, e.g., when WREN is high, whereas strong driver 626 may be turned off by NAND gate 652 when either sense pulse 1 (SP1) or sense pulse 2 (SP2) is low. When strong driver 626 is turned off, bit line 120 is only driven by weak driver 628, resulting in a higher effective resistance of bit line driver 622 between $V_{CC}$ and bit line 120. The two sense pulse signals, SP1 and SP2, control PMOS pass-gate transistors 662 and 666, respectively, which in turn respectively couple bit line 120 to sense cap 664 or 668 when the respective sense pulse signal is low.

In embodiments, a write operation may continue as long as WREN is high. For a short period of time, strong driver 626 may be turned off when SP1 or SP2 is low. When one of the pass-gates is activated, the bit line voltage is sampled onto the corresponding sense cap. When the sense pulse signal returns to high, the pass-gate is deactivated, and the sense cap may hold the sampled voltage value until the pass-gate is activated next time.

Sense caps 664 and 668 are coupled to comparator 680. Comparator 680 may compare the values between two consecutive samples when a comparator enable signal CPEN is high. By comparing the voltages from two consecutive samples, comparator 680 may detect whether the bit in cell 142 has switched between the two consecutive samples. For example, a write completion of the write operation may be detected based on the sensing margin between two consecutive samples (e.g., the difference in the sampled voltages), such as when the sensing margin is greater than a predetermined threshold. In some embodiments, the threshold may be adjustable according to the application associated with the memory array.

Comparator 680 may output the comparison result to logic 690, which may control WREN. Logic 690 may be designed to toggle WREN to low, thus to turn off the write driver and terminate the write operation. For resistive memory, the read time is much faster than the write time. Hence, read energy is much smaller than write energy. For example, read energy may be about 5% of write energy for STT-MRAM in contemporary process technologies. Therefore, power saving in a write operation may be significant in the whole memory operation, including reading and writing.

Figure 7:
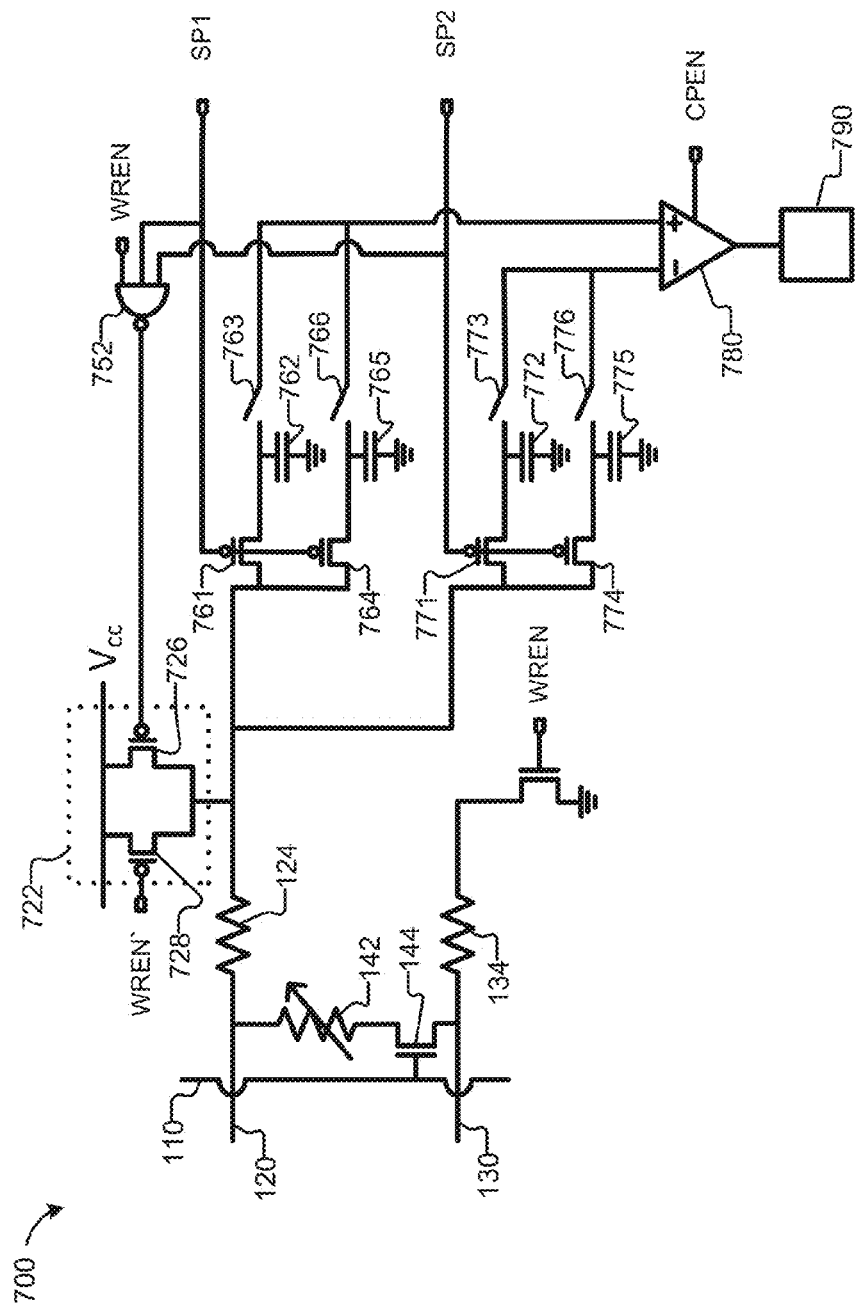
FIG. 7 is another schematic architecture for detecting write completion in a memory cell, incorporating aspects of the present disclosure, in accordance with various embodiments.

FIG. 7 illustrates schematic architecture of a write completion detection structure 700 for detecting write completion in a memory cell, incorporating aspects of the present disclosure, in accordance with various embodiments. Those elements of FIG. 7 having the same reference numbers (or names) as the elements of any other figure can operate or function in any manner similar to that described, but are not limited to such. So as not to obscure the embodiments, elements and features discussed previously may not be repeated.

In embodiments, weak driver 728 may stay on during the entire duration of a write operation, e.g., when WREN is high, whereas strong driver 726 may be turned off by NAND gate 752 when either SP1 or SP2 is low. When strong driver 726 is turned off, bit line 120 is only driven by weak driver 728, resulting in a higher effective resistance of bit line driver 722 between $V_{CC}$ and bit line 120.

SP1 may be operatively coupled to and control pass-gate transistors 761 and 764, which in turn are respectively coupled to sense cap 762 and 765, which are operatively coupled to respective switches 763 and 766. Similarly, $SP_2$ may be operatively coupled to and control pass-gate transistors 771 and 774, which in turn are respectively coupled to sense cap 772 and 775, which are operatively coupled to respective switches 773 and 776.

In embodiments, a write operation may continue as long as WREN is high. For a short period of time, strong driver 726 may be turned off when SP1 or SP2 is low. When one of the pass-gates is activated, the bit line voltage is sampled onto the corresponding sense caps. As an example, when SP1 is low, the bit line voltage will be sampled onto sense caps 762 and 765. As another example, when SP2 is low, the bit line voltage will be sampled onto sense caps 772 and 775. When the sense pulse signal returns to high, the pass-gate is deactivated, and the sense cap may hold the sampled voltage value until it has been read. In embodiments, reading the voltage value held in a sense cap may be destructive. Therefore, only the first reading from a sense cap may be accurate.

In embodiments, the sample-and-hold operations may take place multiple times during a write operation. With appropriate operations of switches 763, 766, 773, and 776, comparator 780 may selectively compare information stored in selective sense caps. A sense pulse, SP1 or SP2, may be set to low for a short period of time. The bit line voltage will dip when the sense pulse is low due to the increased effective resistance of bit line driver 722. As an example, when SP1 is low, the bit line voltage may be sampled onto the pair of sense caps 762 and 765. Next, when SP2 is low, the bit line voltage may be sampled onto the pair of sense caps 772 and 775.

In embodiments, the bit in cell 142 may or may not be switched during two consecutive samplings of the bit line voltage. Therefore, multiple comparisons conducted by comparator 780 may be necessary to identify the write completion of a write operation. As discussed above, a reading of the voltage information stored in one sense cap by comparator 780 in one comparison may be destructive. However, another good copy of the same voltage information is preserved in a paired sense cap. Therefore, multiple comparisons may be conducted by comparator 780 using accurate voltage information associated with the same sampling event.

As an example, comparator 780 may first compare the voltage values stored in sense caps 762 and 772 by connecting switches 763 and 773 after a sampling operation is completed. Then, after another sampling operation is completed, comparator 780 may compare the voltage values stored in sense caps 765 and 775 by connecting switches 766 and 776. In this example, the first comparison and the second comparison are independent and will not interfere with each other. Therefore, both comparisons may be based on accurate information.

In embodiments, a significant sensing margin, which is the difference between the two voltage values stored in two sensing caps, e.g., a sensing margin above a threshold, may trigger a transition in the comparator output to logic 790, which subsequently may cause WREN to become low, thus terminating the write operation.

Figure 8:
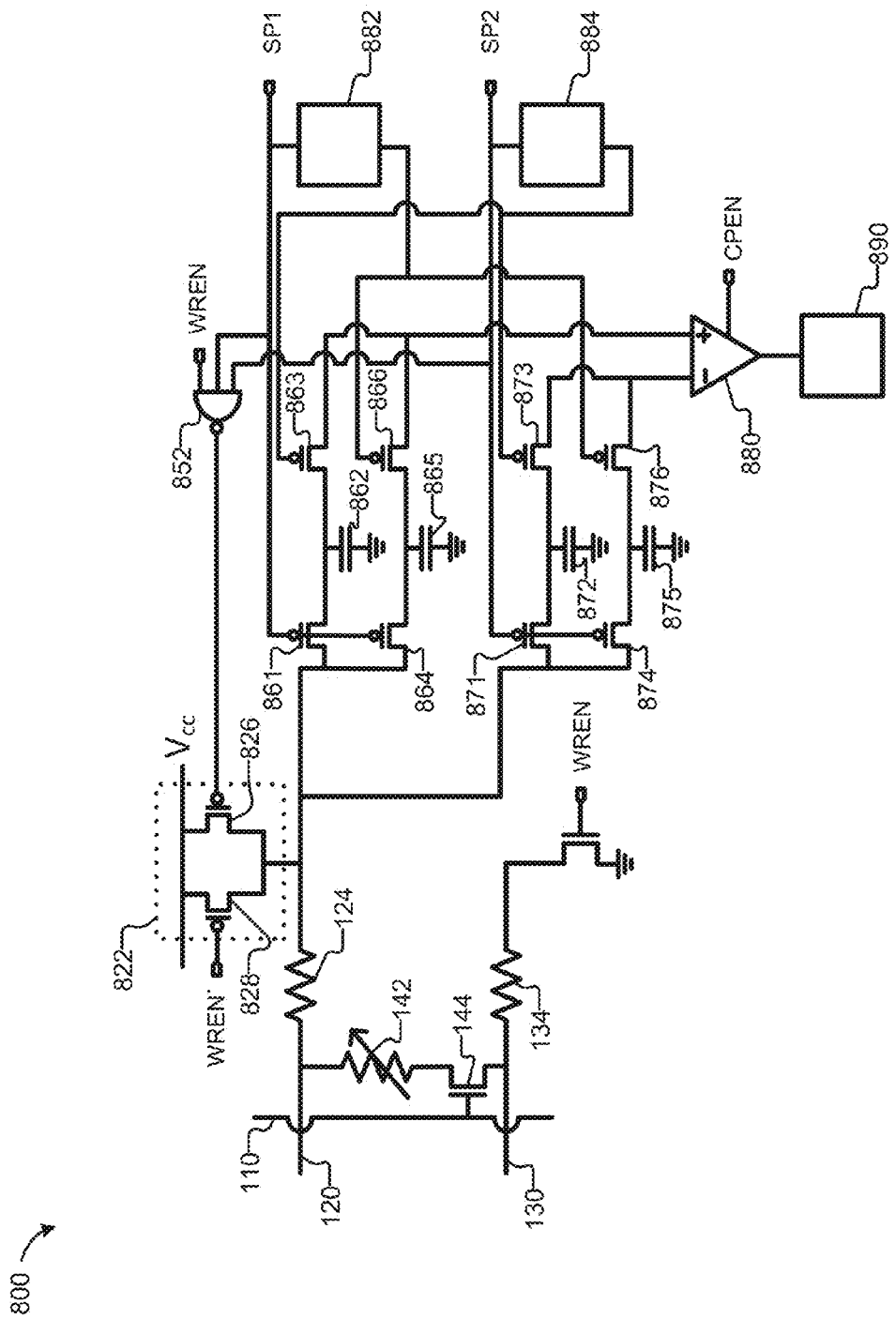
FIG. 8 is another schematic architecture for detecting write completion in a memory cell, incorporating aspects of the present disclosure, in accordance with various embodiments.

FIG. 8 illustrates schematic architecture of a write completion detection structure 800 for detecting write completion in a memory cell, incorporating aspects of the present disclosure, in accordance with various embodiments. Those elements of FIG. 8 having the same reference numbers (or names) as the elements of any other figure can operate or function in any manner similar to that described, but are not limited to such. So as not to obscure the embodiments, elements and features discussed previously may not be repeated.

In embodiments, weak driver 828 may stay on during the entire duration of a write operation, e.g., when WREN is high, whereas strong driver 826 may be turned off by NAND gate 852 when either SP1 or SP2 is low. When strong driver 826 is turned off, bit line 120 is only driven by weak driver 828, resulting in a higher effective resistance of bit line driver 822 between $V_{CC}$ and bit line 120.

SP1 may be operatively coupled to and control transistors 861 and 864, which in turn are respectively coupled to sense cap 862 and 865, which are operatively coupled to respective transistors 863 and 866. Similarly, SP2 may be operatively coupled to and control pass-gate transistors 871 and 874. Pass-gate transistors 871 and 874 may be coupled to sense cap 872 and 875, respectively; and sense caps 872 and 875 may be operatively coupled to respective transistors 873 and 876. SP1 may also be operatively coupled to and control delay element 882, which in turn is coupled to transistors 866 and 876. Similarly, SP2 may also be operatively coupled to and control delay element 884, which in turn is coupled to transistors 863 and 873.

In embodiments, a write operation may continue as long as WREN is high. For a short period of time, strong driver 826 may be turned off when SP1 or SP2 is low. When one of transistors 861, 864, 871, or 874 is activated, the bit line voltage is sampled onto the corresponding sense cap. As an example, when SP1 is low, the bit line voltage will be sampled onto sense caps 862 and 865. As another example, when SP2 is low, the bit line voltage will be sampled onto sense caps 872 and 875. When the sense pulse signal returns to high, the corresponding transistor is deactivated, and the corresponding sense cap may hold the sampled voltage value until it has been read.

In embodiments, delay element 882 or 884 may cause the transistor to which it is coupled to be activated after a delay. As an example, after the bit line voltage has been sampled onto sense caps 862 and 865 based on SP1, transistors 866 and 876 may be activated. Subsequently, the voltage values stored in sense caps 865 and 875 may be compared by comparator 880. In some embodiments, comparator 880 may skip the comparison when there is only one sample of the bit line voltage.

Next, after the bit line voltage has been sampled onto sense caps 865 and 875 based on SP2, transistors 863 and 873 may be activated. Subsequently, the voltage values stored in sense caps 862 and 872 may be compared by comparator 880. Therefore, the sample-and-hold operations may take place multiple times during a write operation. With appropriate operations of delay elements 882 and 884, comparator 880 may selectively compare information stored in selective sense caps as described above. In embodiments, a significant sensing margin may trigger comparator 880 to output to logic 890, which subsequently may cause WREN to become low, thus to turn off the write driver and terminate the write operation.

Figure 9:
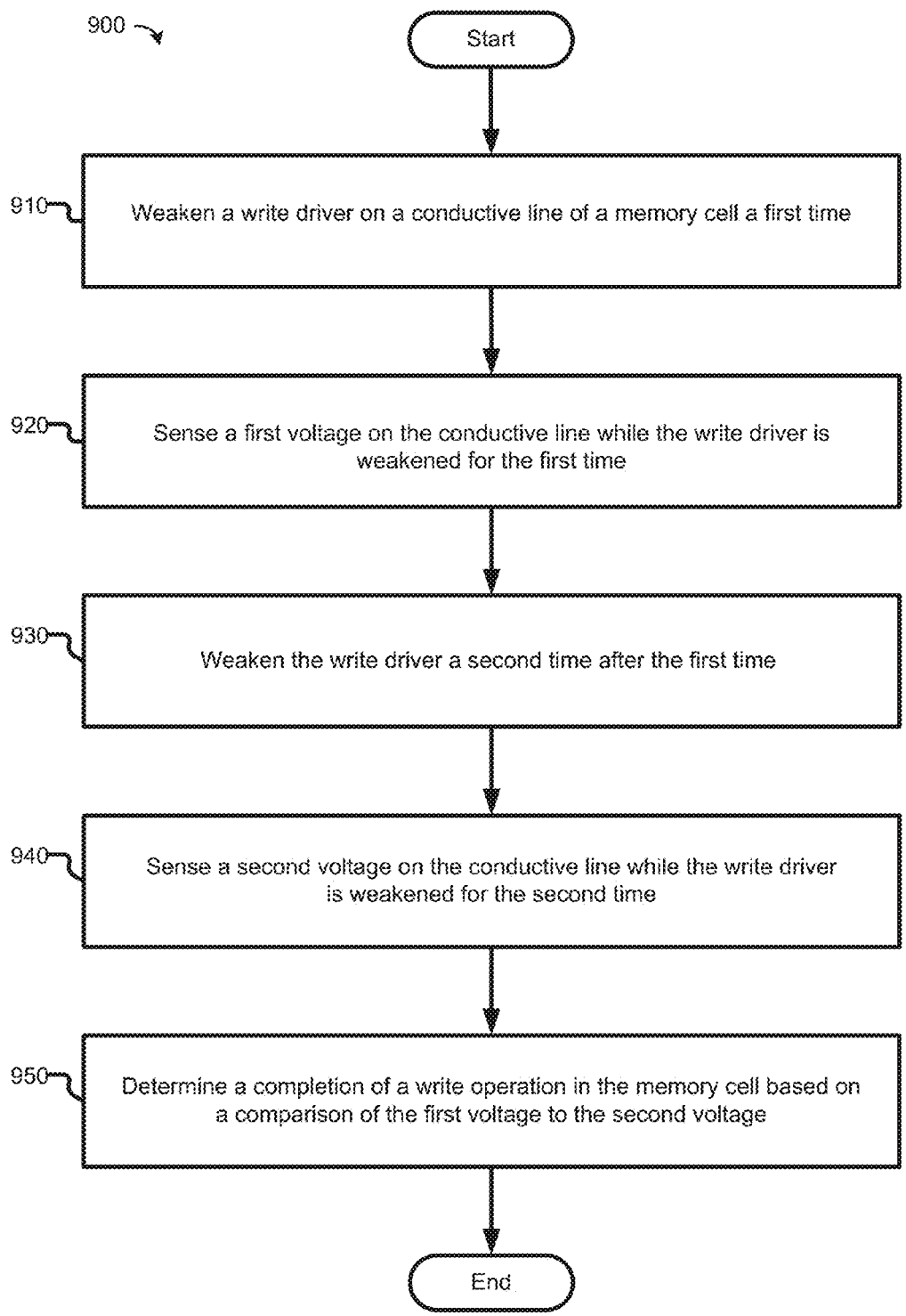
FIG. 9 is a flow diagram of an example write completion detection process executable by an example apparatus incorporating aspects of the present disclosure, in accordance with various embodiments.

FIG. 9 is a flow diagram of an example write completion detection process executable by an example apparatus incorporating aspects of the present disclosure, in accordance with various embodiments. As shown, process 900 may be performed by a device with any one structure disclosed in FIG. 1-9 to implement one or more embodiments of the present disclosure.

In embodiments, the process may begin at block 910, where a write driver on a conductive line of a memory cell may be weakened a first time. In embodiments, weakening a driver may include increasing an effective resistance of the driver. In embodiments, weakening a driver may include turning off the driver. In embodiments, the timing and duration of weakening the driver may be based on a sense pulse received by the driver.

Next, at block 920, a first voltage on the conductive line may be sensed while the write driver is weakened for the first time. In embodiments, the voltage sensed for the first time may be stored in one or more sense caps.

Next, at block 930, the write driver may be weakened a second time. In embodiments, weakening the driver the first time may occur before the bit switch in the memory cell. Weakening the driver the second time may occur after the bit switch in the memory cell.

Next, at block 940, a second voltage on the conductive line may be sensed while the writer driver is weakened for the second time. In embodiments, the voltage sensed for the second time may be stored in one or more sense caps.

Next, at block 950, a completion of a write operation in the memory cell may be determined based on a comparison of the first voltage to the second voltage. In embodiments, the difference between the first voltage and the second voltage may be compared with a predetermined threshold. In one embodiment, the predetermined threshold may be about 100 mV in an application associated with an STT-MRAM array. In other embodiments, the predetermined threshold may be configured based on other applications associated with the memory cell. In embodiments, voltage values stored in multiple sense caps may be selectively compared to determine whether the write operation is completed in two consecutive samples. In embodiments, upon the detection of the write completion, a write current used for the write operation may be reduced or terminated to save power. In embodiments, the write enable signal to the source line driver of the memory cell may be turned to low or turned off in order to reduce or terminate the write current.

Figure 10:
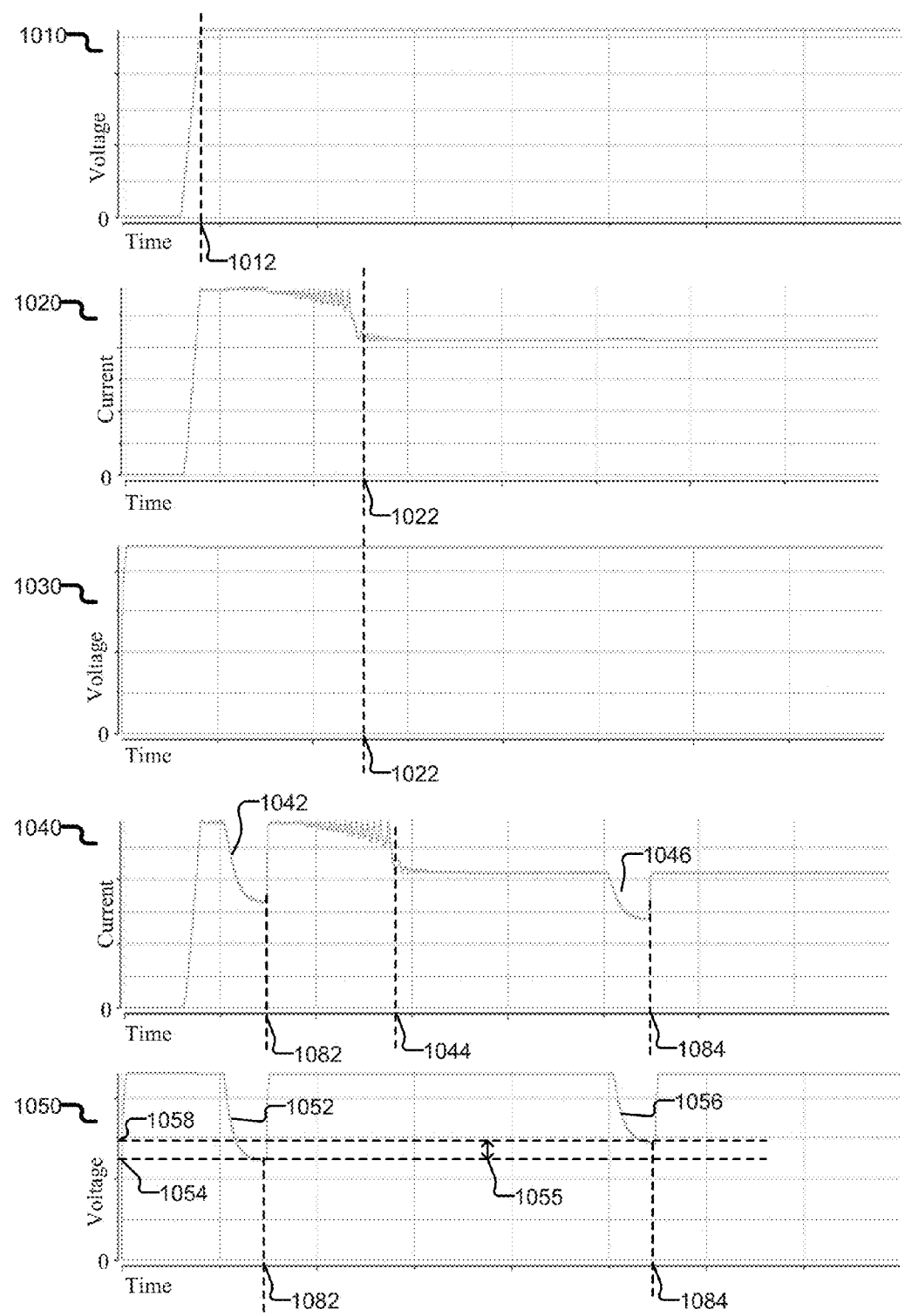
FIG. 10 is a set of plots showing operations of detecting write completion in a write operation, incorporating aspects of the present disclosure, in accordance with various embodiments.

FIG. 10 is a set of plots showing operations of detecting write completion in a write operation, incorporating aspects of the present disclosure, in accordance with various embodiments. Plots may show simulation waveforms of a circuit in the application of an STT-MRAM array. Plot 1010 applies to either with or without weakening the bit line. Plots 1020 and 1030 are baseline reads without weakening the bit line, while plots 1040 and 1050 incorporate aspects of the present disclosure to detect the write completion to a memory cell with weakening the bit line.

The read in plot 1010 shows the word line voltage, e.g., on word line 110. As shown, the word line voltage stays high during the write operation, starting from time 1012.

The read in plot 1020 shows the write current without weakening the bit line driver. As shown, the write current dropped when the bit that is being written has switched to the intended state at time 1022.

The read in plot 1030 shows the bit line voltage stays high when the bit line driver is not weakened. As shown, no difference is seen before and after the bit switch, e.g., before and after time 1022.

The read in plot 1040 shows the write current after weakening the bit line driver twice. As shown, the current drop 1042 is caused by weakening the bit line driver the first time, and the write current resumes to its previous level at time 1082 once the bit line driver is no longer being weakened. Next, the write current drops again at time 1044 when the bit that is being written has switched to the intended state with a different resistance value, consequently cause a drop at the write current. Next, the current drop 1046 is caused by weakening the bit line driver the second time, and the write current resumes again at time 1084 once the bit line driver is no longer being weakened.

The read in plot 1050 is the bit line voltage after weakening the bit line driver twice. The first weakening happens before the bit switch, and causes a voltage droop 1052 to the voltage level 1054, e.g., at time 1082. The second weakening happens after the bit switch, and causes another voltage droop 1056 to the voltage level 1058, e.g., at time 1084. Voltage level 1054 and voltage level 1058 have a voltage difference 1055 of about 100 mV in this case. Voltage difference 1055 is the sensing margin at the bit line, and may indicate the bit in the memory cell has switched between time 1082 and time 1084 when voltage difference 1055 is sufficiently large, e.g., greater than a predetermined threshold. As an example, voltage difference 1055 of about 100 mV in this case indicates the bit has switched. Compared to the read in plot 1030, even if one were to sample voltage on the bit line at time 1082 and time 1084 as in plot 1050, no voltage difference would be detected because the bit line voltage would remain substantially constant without weakening the bit line driver as shown in plot 1030.

The plots shown in FIG. 10 and discussed above show that weakening the bit line driver may result in about 100 mV or greater difference in bit line voltage before and after the bit switch. Moreover, as shown in plots 1020 and 1040, the comparison between with and without the weakening the write driver also shows that the weakening does not significantly delay the bit switching time. As a result, these plots show that a short duration of write-driver weakening does not reset the switching mechanism of the memory storage element, e.g., a magnetic tunnel junction (MTJ) in this case.

Figure 11:
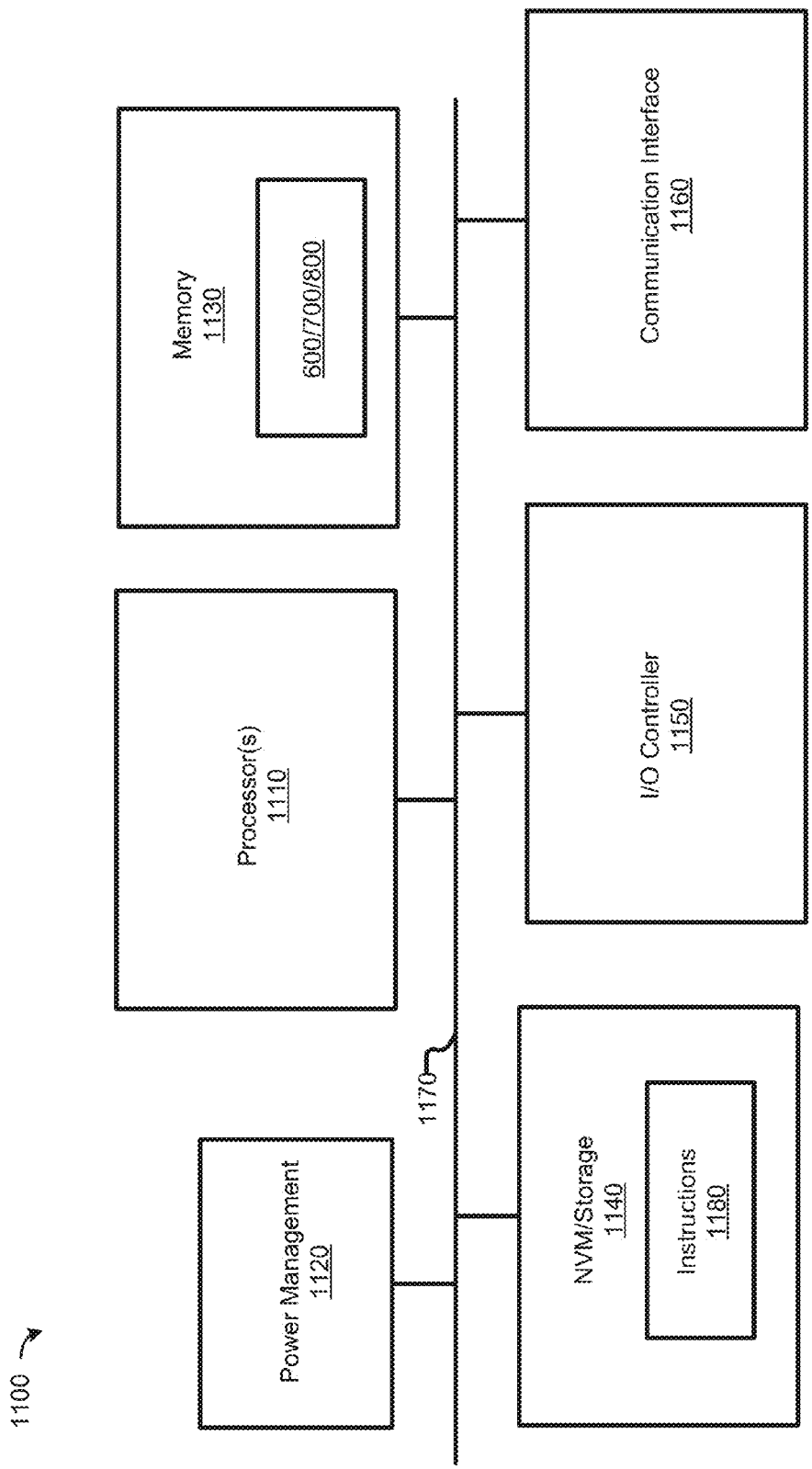
FIG. 11 is a block diagram that illustrates an example computer system suitable for practicing the disclosed embodiments, in accordance with various embodiments.

FIG. 11 is a block diagram that illustrates an example computer system 1100 suitable for practicing the disclosed embodiments with any of the design principles described with reference to FIGS. 1-9, in accordance with various embodiments. In one embodiment, computing system 1100 represents a mobile computing device, such as a computing tablet, a mobile phone or smartphone, a wireless-enabled e-reader, or another wireless mobile device. It will be understood that certain components are shown generally, and not all components of such a device are shown in computing device 1100.

As shown, the computer system 1100 may include a power management 1120; a number of processors or processor cores 1110; a system memory 1130 having at least one write completion detection structure 600, 700, or 800; a non-volatile memory (NVM)/storage 1140 having processor-readable and processor-executable instructions 1180 stored therein; an I/O controller 1150; and a communication interface 1160. For the purpose of this application, including the claims, the terms "processor" and "processor cores" may be considered synonymous, unless the context clearly requires otherwise. Those elements of FIG. 11 having the same reference numbers (or names) as the elements of any other figure can operate or function in any manner similar to that described, but are not limited to such.

In one embodiment, processors 1110 may include one or more physical devices, such as microprocessors, application processors, microcontrollers, programmable logic devices, or other processing means. The processing operations performed by processors 1110 may include the execution of an operating platform or operating system on which applications and/or device functions are executed. The processing operations may include operations related to input/output (I/O) with a human user or with other devices, operations related to power management, and/or operations related to connecting the computing device 1100 to another device. The processing operations may also include operations related to audio I/O and/or display I/O.

In various embodiments of the present disclosure, at least one of the processors 1110, including a controller, may generate or cause a signal to be generated for a write operation in memory 1130 or other memories in processors 1110, e.g., a CPU cache. The write completion detection structure 600, 700, or 800 may detect whether a bit that is being written has switched to the intended state, and adaptively turn off the write current on the bit accordingly to save energy. In various embodiments, write completion detection structure 600, 700, or 800 may reside in processors 1110.

The one or more NVM/storage 1140 and/or the memory 1130 may comprise a tangible, non-transitory computer-readable storage device (such as a diskette, hard drive, compact disc read only memory (CD-ROM), hardware storage unit, flash memory, phase change memory (PCM), solid-state drive (SSD) memory, and so forth). Instructions 1180 stored in the NVM/storage 1140 and/or the memory 1130 may be executable by one or more of the processors 1110. Instructions 1180 may contain particular instructions to enable or disable the write completion detection operations in memory 1130.

The computer system 1100 may also comprise input/output devices (not shown) coupled to the computer system 1100 via I/O controller 1150. I/O controller 1150 illustrates a connection point for additional devices that connect to computing device 1100 through which a user might interact with the system. For example, various devices that may be coupled to the computer system 1100 via I/O controller 1150 may include microphone devices, speaker or stereo systems, video systems or other display devices, keyboard or keypad devices, or other I/O devices for use with specific applications such as card readers or other devices. In various embodiments, I/O controller 1150 may manage other devices such as accelerometers, cameras, light sensors or other environmental sensors, or other hardware.

In embodiments, communication interface 1160 may provide an interface for computing device 1100 to communicate over one or more network(s) and/or with any other suitable device. Communication interface 1160 may include any suitable hardware and/or firmware, such as a network adapter, one or more antennas, wireless interface(s), and so forth. In various embodiments, communication interface 1160 may include an interface for computing device 1100 to use near field communication (NFC), optical communications, or other similar technologies to communicate directly (e.g., without an intermediary) with another device. In various embodiments, communication interface 1160 may interoperate with radio communications technologies such as, for example, Wideband Code Division Multiple Access (WCDMA), Global System for Mobile Communications (GSM), Long Term Evolution (LTE), WiFi, Bluetooth®, Zigbee, and the like.

The various elements of FIG. 11 may be coupled to each other via a system bus 1170, which represents one or more buses. In the case of multiple buses, they may be bridged by one or more bus bridges (not shown). Data may pass through the system bus 1170 through the I/O controller 1150, for example, between an output terminal and the processors 1110.

System memory 1130 and NVM/storage 1140 may be employed to store a working copy and a permanent copy of the programming instructions implementing one or more operating systems, firmware modules or drivers, applications, and so forth, herein collectively denoted as instructions 1180. In embodiments, instructions 1180 may include logic for write completion detection described in connection with FIG. 9. The permanent copy of the programming instructions may be placed into permanent storage in the factory, or in the field, via, for example, a distribution medium (not shown), such as a compact disc (CD), or through the communication interface 660 (from a distribution server (not shown)).

In some embodiments, at least one of the processor(s) 1110 may be packaged together with memory having structures 600/700/800. In some embodiments, at least one of the processor(s) 1110 may be packaged together with memory having structures 600/700/800 to form a System in Package (SiP). In some embodiments, at least one of the processor(s) 1110 may be integrated on the same die with memory having structures 600/700/800. In some embodiments, at least one of the processor(s) 1110 may be integrated on the same die with memory having structures 600/700/800 to form a System on Chip (SoC).

According to various embodiments, one or more of the depicted components of the system 1100 and/or other element(s) may include a keyboard, LCD screen, non-volatile memory port, multiple antennas, graphics processor, application processor, speakers, or other associated mobile device elements, including a camera. The remaining constitution of the various elements of the computer system 1100 is known, and accordingly will not be further described in detail.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments that have been described above may be modified without departing from the teachings in connection with FIGS. 1-11. These and other modifications can be made in light of the above detailed description. The terms used in the following claims should not be construed to be limited to the specific embodiments disclosed in the specification.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is always only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications, and variations of such embodiments will be apparent to those of ordinary skill in the art in light of the foregoing description. For example, other memory architectures, e.g., Dynamic RAM (DRAM), may use the embodiments discussed. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to the implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus for write completion detection, which may include a resistive memory cell coupled to a conductive line and a driver coupled to the conductive line to drive current for the resistive memory cell during a write operation. Furthermore, the apparatus may include a write completion detection circuit coupled to the driver to selectively increase a resistance of the driver for two or more time periods during the write operation, and to detect a write completion for the resistive memory cell based on a voltage change on the conductive line for successive time periods of the two or more time periods.

Example 2 may include the subject matter of Example 1, and may further specify that the conductive line is a bit line or a source line.

Example 3 may include the subject matter of Example 1 or 2, and may further specify the driver has an adjustable resistance, and the write completion detection circuit is to increase the adjustable resistance during the two or more time periods.

Example 4 may include any subject matter of Examples 1-2, and may further specify that the driver includes a strong driver with a first resistance and a weak driver with a second resistance, and the first resistance is smaller than the second resistance.

Example 5 may include the subject matter of Example 4, and may further specify that the write completion detection circuit is to maintain the weak driver on during the two or more time periods, and is to deactivate the strong driver during the two or more time periods for detecting the voltage change on the conductive line.

Example 6 may include any subject matter of Examples 1-5, and may further specify that the write completion detection circuit is to turn off the driver during the two or more time periods to detect the voltage change on the conductive line.

Example 7 may include any subject matter of Examples 1-6, and may further specify that the write completion detection circuit may include a first sense cap, coupled to the conductive line, to store information of a first voltage in response to a first sense pulse; a second sense cap, coupled to the conductive line, to store information of a second voltage in response to a second sense pulse; and a comparator, coupled to the first and second sense caps, to compare the information of the first voltage with the information of the second voltage to detect the write completion for the memory cell.

Example 8 may include any subject matter of Examples 1-6, and may further include a first sense cap and a second sense cap coupled to the conductive line to store information of a first voltage in response to a first sense pulse; and a third sense cap and a fourth sense cap coupled to the conductive line to store information of a second voltage in response to a second sense pulse, wherein the first sense pulse and the second sense pulse are two consecutive sense pulses; and a comparator, coupled to the first, second, third, and fourth sense caps, to perform a first comparison using the first and third sense caps and to perform a second comparison using the second and fourth sense caps.

Example 9 may include the subject matter of Example 7 or 8, and may further specify that the write completion detection circuit may further includes logic, coupled to the comparator, to turn off the driver or another driver when a difference between the first and the second voltage is greater than a threshold.

Example 10 may include the subject matter of Example 7 or 8, and may further include a gate, coupled to the driver, to output a control signal to the driver based at least in part on the first sense pulse or the second sense pulse.

Example 11 may include any subject matter of Examples 1-10, and may further specify that the resistive memory is at least one of spin transfer torque magnetic random access memory, resistive random access memory, or conductive bridging random access memory.

Example 12 is a system for write completion detection, which may include a processor, a controller coupled to the processor to input/output data processed by the processor, and a memory coupled to the processor. The memory may include a memory cell coupled to a conductive line; and a first driver with a first resistance and a second driver with a second resistance, coupled to the conductive line, to drive current for the memory cell during a write operation; and a write completion detection circuit to selectively deactivate the first driver during two or more time periods to detect a write completion of the memory cell based on a voltage change on the conductive line. The first resistance may be smaller than the second resistance.

Example 13 may include the subject matter of Example 12, and may further specify that the conductive line is a bit line or a source line.

Example 14 is a method for write completion detection, which may include weakening a write driver on a conductive line of a memory cell for a first time period; sensing a first voltage on the conductive line while the write driver is weakened for the first time period; weakening the write driver for a second time period after the first time period; sensing a second voltage on the conductive line while the write driver is weakened for the second time period; and determining a completion of a write operation in the memory cell based on a comparison of the first voltage to the second voltage.

Example 15 may include the subject matter of Example 14, and may further specify that weakening may include increasing a resistance of the write driver.

Example 16 may include the subject matter of Example 14, and may further specify that weakening may include turning off the write driver.

Example 17 may include any subject matter of Examples 14-16, and may further specify that the weakening the write driver for the first time period occurs before a bit switch of the memory cell, and the weakening the write driver for the second time period occurs after the bit switch of the memory cell.

Example 18 may include any subject matter of Examples 14-17, and may further specify that determining the write completion includes comparing a difference between the first voltage and the second voltage with a predetermined threshold.

Example 19 may include the subject matter of Example 18, and may further specify that the predetermined threshold is about 100 mV.

Example 20 may include the subject matter of Example 18 or 19, and may further specify that the predetermined threshold is configured based on an application associated with the memory cell.

Example 21 may include any subject matter of Examples 14-20, and may further include determining a timing and a duration of the weakening the write driver based on a sense pulse received by the write driver.

Example 22 may include any subject matter of Examples 14-21, and may further include reducing a write current used for the write operation in response to the determined completion of the write operation.

Example 23 may include the subject matter of Example 22, and may further specify that reducing the write current includes turning off the write driver.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus, comprising:
   a resistive memory cell coupled to a conductive line;
   a driver coupled to the conductive line to drive current for the resistive memory cell during a write operation; and
   a write completion detection circuit coupled to the driver to selectively increase a resistance of the driver for two or more time periods during the write operation, and to detect a write completion for the resistive memory cell based on a voltage change on the conductive line for successive time periods of the two or more time periods, wherein the write completion detection circuit includes:
   a first sense capacitor, coupled to the conductive line, to store information of a first voltage in response to a first sense pulse;
   a second sense capacitor, coupled to the conductive line, to store information of a second voltage in response to a second sense pulse; and
   a comparator, coupled to the first and second sense capacitors, to compare the information of the first voltage with the information of the second voltage to detect the write completion for the memory cell.

2. The apparatus of claim 1, wherein the conductive line is a bit line or a source line.

3. The apparatus of claim 1, wherein the driver comprises an adjustable resistance, and wherein the write completion detection circuit is to increase the adjustable resistance during the two or more time periods.

4. The apparatus of claim 1, wherein the driver comprises a strong driver with a first resistance and a weak driver with a second resistance, and wherein the first resistance is smaller than the second resistance.

5. The apparatus of claim 4, wherein the write completion detection circuit is to maintain the weak driver on during the two or more time periods, and is to deactivate the strong driver during the two or more time periods for detecting the voltage change on the conductive line.

6. The apparatus of claim 1, wherein the write completion detection circuit is to turn off the driver during the two or more time periods to detect the voltage change on the conductive line.

7. The apparatus of claim 1, wherein the write completion detection circuit further comprises logic, coupled to the comparator, to turn off the driver when a difference between the first and the second voltage is greater than a threshold.

8. The apparatus of claim 1, further comprising:
a gate, coupled to the driver, to output a control signal to the driver based at least in part on the first sense pulse or the second sense pulse.

9. The apparatus of claim 1, wherein the write completion detection circuit further comprises:
a third sense capacitor coupled to the conductive line to store information of the first voltage in response to the first sense pulse;
a fourth sense capacitor coupled to the conductive line to store information of the second voltage in response to the second sense pulse, wherein the first sense pulse and the second sense pulse are two consecutive sense pulses; and
a comparator, coupled to the first, second, third, and fourth sense capacitors, to perform a first comparison using the first and second sense capacitors and to perform a second comparison using the third and fourth sense capacitors.

10. The apparatus of claim 1, wherein the resistive memory is at least one of:
spin transfer torque magnetic random access memory;
resistive random access memory; or
conductive bridging random access memory.

11. A system, comprising:
a processor;
a controller coupled to the processor to input/output data processed by the processor; and
a memory coupled to the processor, the memory comprises:
a memory cell coupled to a conductive line;
a first driver with a first resistance and a second driver with a second resistance, coupled to the conductive line, to drive current for the memory cell during a write operation, wherein the first resistance is smaller than the second resistance; and
a write completion detection circuit to selectively deactivate the first driver during two or more time periods to detect a write completion of the memory cell based on a voltage change on the conductive line, wherein the write completion detection circuit comprises:
a first sense capacitor, coupled to the conductive line, to store information of a first voltage in response to a first sense pulse;
a second sense capacitor, coupled to the conductive line, to store information of a second voltage in response to a second sense pulse; and
a comparator, coupled to the first and second sense capacitors, to compare the information of the first voltage with the information of the second voltage to detect the write completion for the memory cell.

12. The system of claim 11, wherein the conductive line is a bit line or a source line.

13. A method, comprising:
weakening a write driver on a conductive line of a memory cell for a first time period;
sensing a first voltage on the conductive line while the write driver is weakened for the first time period;
weakening the write driver for a second time period after the first time period;
sensing a second voltage on the conductive line while the write driver is weakened for the second time period; and
determining a completion of a write operation in the memory cell based on a comparison of a difference between the first voltage and the second voltage with a predetermined threshold, wherein the predetermined threshold is about 100 milliVolts (mV).

14. The method of claim 13, wherein weakening comprises increasing a resistance of the write driver.

15. The method of claim 13, wherein weakening comprises turning off the write driver.

16. The method of claim 13, wherein the weakening the write driver for the first time period occurs before a bit switch of the memory cell, and wherein the weakening the write driver for the second time period occurs after the bit switch of the memory cell.

17. The method of claim 13, wherein the predetermined threshold is configured based on an application associated with the memory cell.

18. The method of claim 13, further comprising:
determining a timing and a duration of the weakening the write driver based on a sense pulse received by the write driver.

19. The method of claim 13, further comprising:
reducing a write current used for the write operation in response to the determined completion of the write operation.

20. The method of claim 19, wherein reducing the write current comprises turning off the write driver.

* * * * *